(12) United States Patent
Hwu et al.

(10) Patent No.: US 8,871,534 B1
(45) Date of Patent: Oct. 28, 2014

(54) METHOD FOR FABRICATING LED LIGHT TUBE

(71) Applicant: Gem Weltronics Twn Corporation, Hsinchu County (TW)

(72) Inventors: Jon-Fwu Hwu, Hsinchu County (TW); Yung-Fu Wu, Hsinchu County (TW); Kui-Chiang Liu, Hsinchu County (TW)

(73) Assignee: Gem Weltronics Twn Corporation, Hsinchu County (TW)

( * ) Notice: Subject to any disclaimer, the term of this patent is extended or adjusted under 35 U.S.C. 154(b) by 0 days.

(21) Appl. No.: 14/019,609

(22) Filed: Sep. 6, 2013

(51) Int. Cl.
*H01L 21/00* (2006.01)
*H01L 33/62* (2010.01)
*H01L 33/64* (2010.01)

(52) U.S. Cl.
CPC .............. *H01L 33/62* (2013.01); *H01L 33/642* (2013.01)
USPC .............................................. 438/22; 438/29

(58) Field of Classification Search
USPC .......................................... 438/22, 29, 31–32
See application file for complete search history.

(56) References Cited

U.S. PATENT DOCUMENTS 7,053,557 B2 * 5/2006 Cross et al. ...................... 315/74
7,438,441 B2 * 10/2008 Sun et al. ...................... 362/294

\* cited by examiner

*Primary Examiner* — Richard Booth
(74) *Attorney, Agent, or Firm* — Lin & Associates IP, Inc.

(57) ABSTRACT

A method for fabricating an LED light tube includes: fabricating a heat dissipation base having a light emitting side with a recess and a reception chamber; disposing one illumination unit and one bridging unit on the recess, wherein the illumination unit and the bridging unit are constituted by LED dies and conductive elements, respectively; fixing a circuit unit on the light emitting side in such a manner that the circuit is located adjacent to the recess; applying wire-bond technique to connect the LED dies and the conductive elements electrically; forming an optical layer over the LED dies; forming a protection layer on the optical layer; establishing electrical connection among the circuit unit, the conductive elements and the LED dies; installing a power supply source within the reception chamber; and disposing a diffusion shield over the dissipation base and two end caps respectively on two ends of the dissipation base.

10 Claims, 10 Drawing Sheets

METHOD FOR FABRICATING LED LIGHT TUBE

BACKGROUND OF THE INVENTION

1. Field of the Invention

The present invention relates to a light emitting diode (LED) light tube, more particularly to a method for fabricating an integrally formed LED light tube provided with a bridging unit.

2. The Prior Arts

Owing to high efficiency, long lasting, small size, low energy consuming, swift in response, and mature advance in the modern electronics lately, a majority of traditional light bulbs or light tubes are gradually replaced with LED light tubes.

A prior art LED light tube generally includes a light tube, a heat dissipation plate, a printed circuit board, a plurality of LED units and two conductive caps. The heat dissipation plate is mounted within the light tube while the printed circuit board is mounted on the heat dissipation plate. The LED units are connected electrically with the printed circuit board.

During the assembly, the LED units are first of all soldered on the printed circuit board, after which, the LED units and the printed circuit board are mounted on the heat dissipation plate via assembly elements. The above-mentioned elements are available in form of finished products, wherein the LED units are manufactured from wafer by high-tech companies, the dies by the medium size companies while the packing is done by small size companies. In addition, the printed circuit board is fabricated via etching, exposure process and coating process.

SUMMARY OF THE INVENTION

A prior art LED light tube includes a plurality of LED units and a printed circuit plate which are fabricated through several processes and they are assembled together so as to form the LED light tube. The preceding several processes and assembly process and several structure of the LED units and the printed circuit plate are in fact not directly related to the LED light tube so that an overall manufacturing cost thereof cannot be reduced, thereby wasting a relatively large amount of materials.

Regarding an LED unit, the high tech companies usually fabricated wafers, which are transported to medium size companies, where the wafer is fabricated into LED dies, each of which is again wire bond and is molded by small size companies via molded compound to produce as the LED unit. It is noted that a large amount of molded compound consisting of fluorescent glue is required to conduct the molded process. The manufacturing cost is therefore high and consequently results in long manufacturing time.

The main objective of the present invention is to provide a method for fabricating an integrally formed LED light tube. The fabricating method includes the following steps: fabricating a heat dissipation base having a light emitting side formed with a recess, the heat dissipation base further having an interior portion defining a reception chamber therein; disposing at least one illumination unit and at least one bridging unit on a bottom surface of the recess, wherein the illumination unit is constituted by a plurality of LED dies and the bridging unit is constituted by a plurality of conductive elements; fixing a circuit unit on the light emitting side of the heat dissipation base in such a manner that the circuit is located adjacent to one side of the recess; applying wire-bond technique in order to connect the plurality of LED dies and the plurality of conductive elements electrically relative to one another; forming an optical layer over the plurality of LED dies; forming a protection layer on said optical layer; establishing electrical connection among the circuit unit, the plurality conductive elements and the plurality of LED dies; installing a power supply source within the reception chamber in the heat dissipation base; and disposing a diffusion shield over the heat dissipation base and two end caps respectively on two opposite ends of the heat dissipation base.

One distinct feature of the present invention resides in that once the LED dies are disposed on the bottom surface of the recess in the heat dissipation base, the optical layer and the protection layer can be sequentially disposed over the LED dies, thereby finishing the production of manufacturing the LED light tube of the present invention. Under such a situation, several components of the prior are deleted, which are in fact not directly related to the LED light tube. There are several specifications for packing the LED light tube.

Another distinct feature of the present invention resides in that the LED dies coupled electrically via the conductive elements for various objective can shorten the distance between adjacent pair of the LED dies. Hence an appropriate adjustment can be conducted among the LED dies in order to achieve densely arrangement of the LED dies so that the LED light tubes thus produced can provide the outmost amount of brightness. At the same time, during the wire-bond operation, since the LED dies and the conducting elements can be kept at appropriate distance, since shorter wires are required for wire bond purpose, tangling among the wires can be avoided.

In accordance with the integrally formed concept, the heat dissipation base with the recess, the illumination unit and the bridging unit are integrally fabricated. The heat dissipation base is fabricated in such a manner to have different longitudinal lengths so as to form the light tubes of different specifications. Hence, the cost of material expense is greatly reduced and hence shortening the manufacture time.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENT

Figure 1:
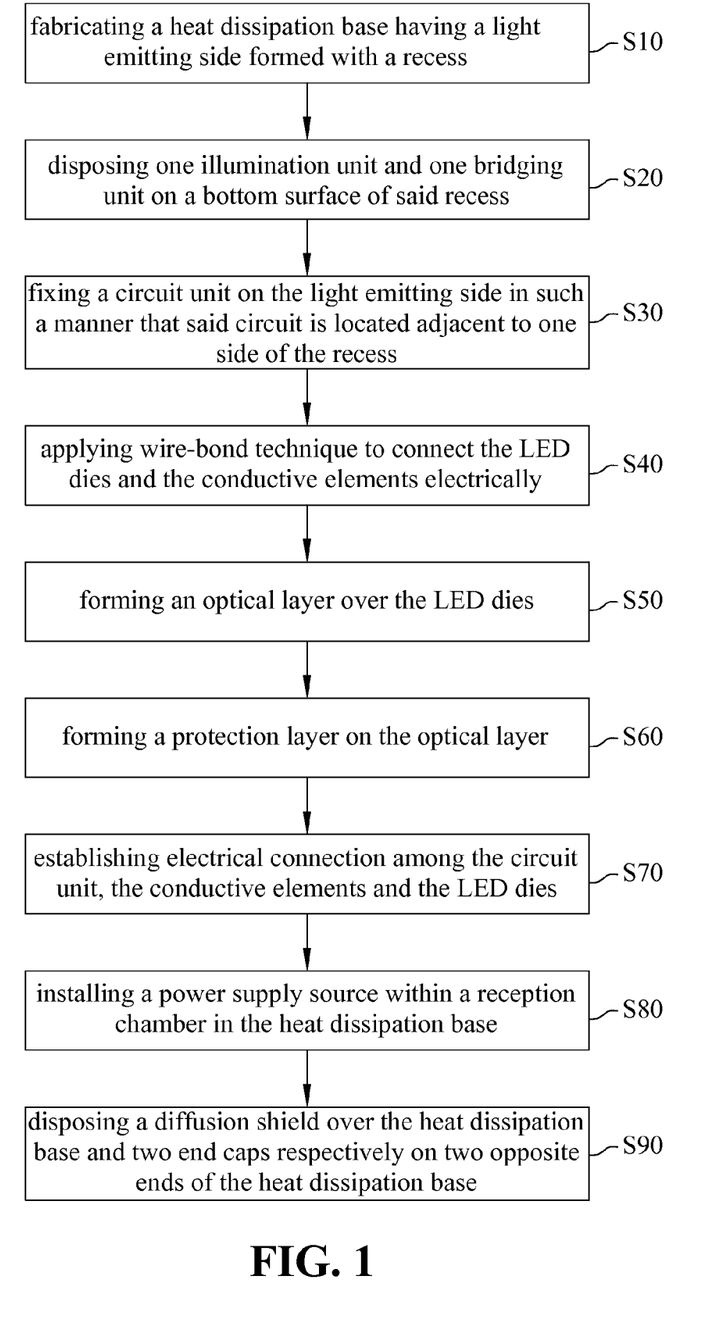
FIG. 1 is a block diagram illustrating the steps in a method for fabricating an integrally formed light emitting diode (LED) light tube of the present invention.
Figure 2:
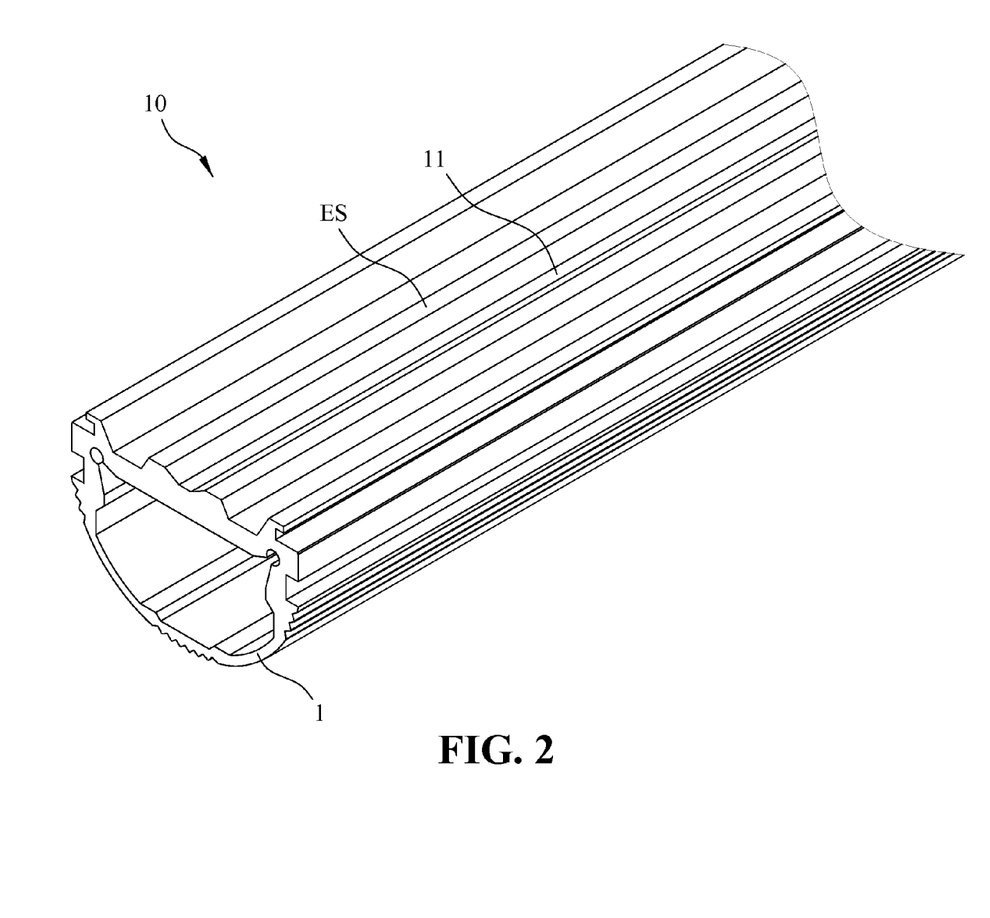
FIG. 2 shows a perspective view of a heat dissipation base employed in the method for fabricating the integrally formed LED light tube of the present invention.

Referring FIGS. 1-2, FIG. 1 is a block diagram illustrating the steps in a method for fabricating an integrally formed light emitting diode (LED) light tube of the present invention; FIG. 2 shows a perspective view of a heat dissipation base employed in the method for fabricating the integrally formed LED light tube of the present invention. As shown in FIG. 1, according to the step S10; a heat dissipation base 1 is fabricated to have a light emitting side ES formed with a recess 11, the heat dissipation base 1 further has an interior portion defining a reception chamber therein, as best shown in FIG. 2.

Preferably, the recess 11 of the heat dissipation base 1 has a bottom surface and two lateral sides, each extending inclinedly from one end of the bottom surface such that the recess 11 is generally V-shaped.

In this embodiment, the heat dissipation base 1 is fabricated from aluminum or other conductive metals via extrusion method or die casting. Preferably, the bottom surface of the recess 11 is undergone sand blasting, high precise milling or roughing treatment such that the bottom surface after treatment possesses the high reflection ability.

In addition, vapor deposition is conducted so as to form an aluminum layer on the bottom surface of the recess 11 so that the bottom surface provides high reflection ability.

Figure 3:
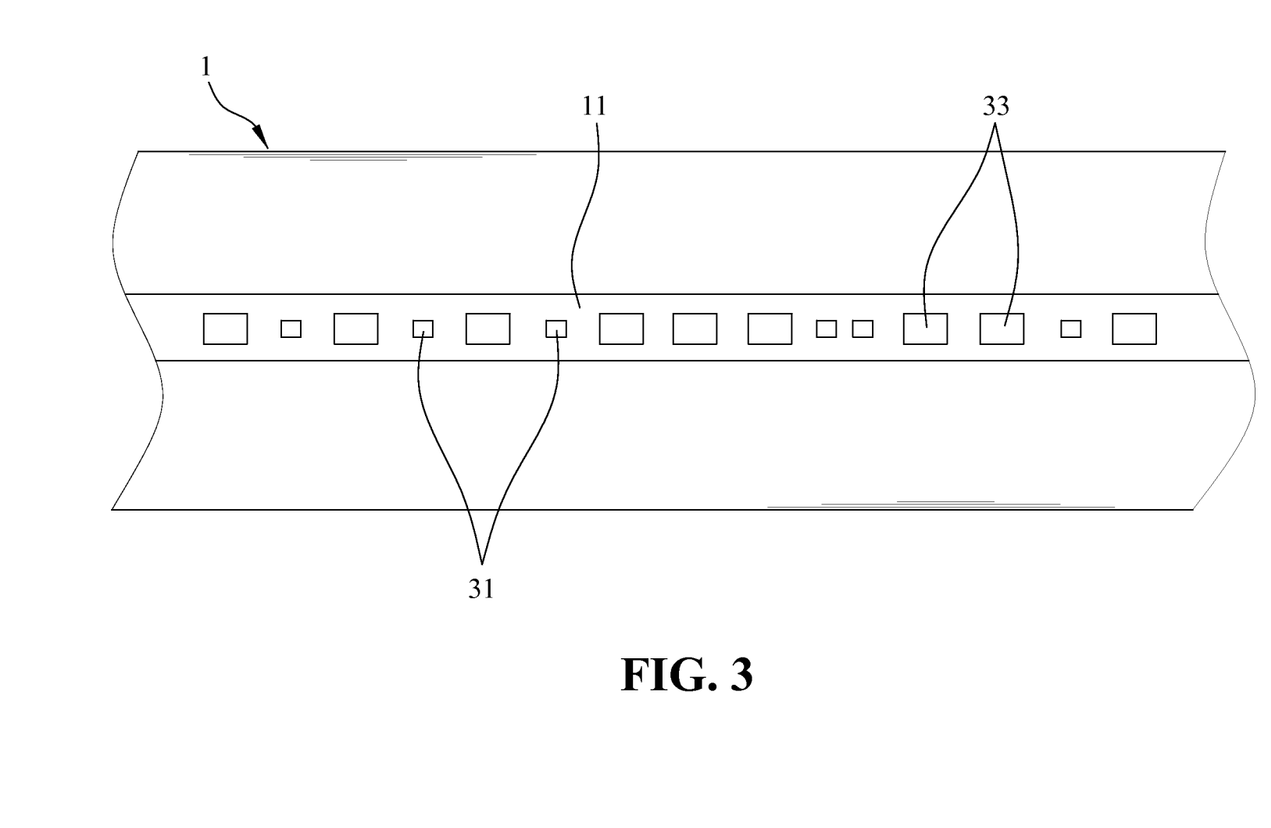
FIG. 3 is a top planar view illustrating arrangement of LED dies and conductive elements employed in the method for fabricating the integrally formed LED light tube of the present invention.

FIG. 3 is a top planar view illustrating arrangement of LED dies and conductive elements employed in the method for fabricating the integrally formed LED light tube of the present invention. In accordance with the step S20, at least one illumination unit and at least one bridging unit are disposed the bottom surface of the recess 11, wherein the illumination unit is constituted by a plurality of LED dies 31 and the bridging unit is constituted by a plurality of conductive elements 33.

Figure 4A:
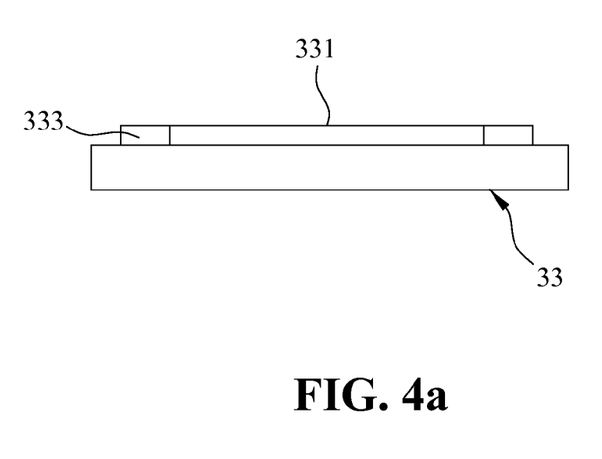
FIG. 4a shows one form of the conductive element employed in the method for fabricating the integrally formed LED light tube of the present invention.
Figure 4B:
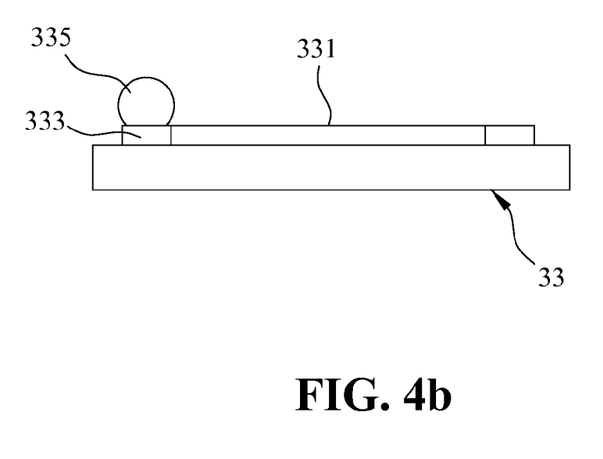
FIG. 4b shows another form of the conductive element employed in the method for fabricating the integrally formed LED light tube of the present invention.

Referring to FIGS. 4a and 4b, wherein FIG. 4a shows one form of the conductive element employed in the method for fabricating the integrally formed LED light tube of the present invention; and FIG. 4b shows another form of the conductive element employed in the method for fabricating the integrally formed LED light tube of the present invention. Also referring to FIG. 4a, each of the conductive elements 33 has a top surface formed with a conductive circuit 331 and two joining pads 333 at two opposite ends of the conductive circuit 331 to facilitate wire bonding or soldering purposes during the fabrication or manufacturing process.

Alternatively, each of the conductive elements 33 further includes at least one soldering ball 335 disposed on one joining pad 333 of a respective one of the conductive elements 33 to facilitate wire bonding or soldering purposes during the manufacturing process, as best shown in FIG. 4b.

In this embodiment, each of the conductive elements 33 is a multi layer structure having a lower layer made from a silicone wafer, a ceramic chip, glass chip, or non-moisture materials. The lower layer is preferably constituted by from bottom to top a titanium layer and an aluminum layer, each is formed through bumping process.

Figure 5:
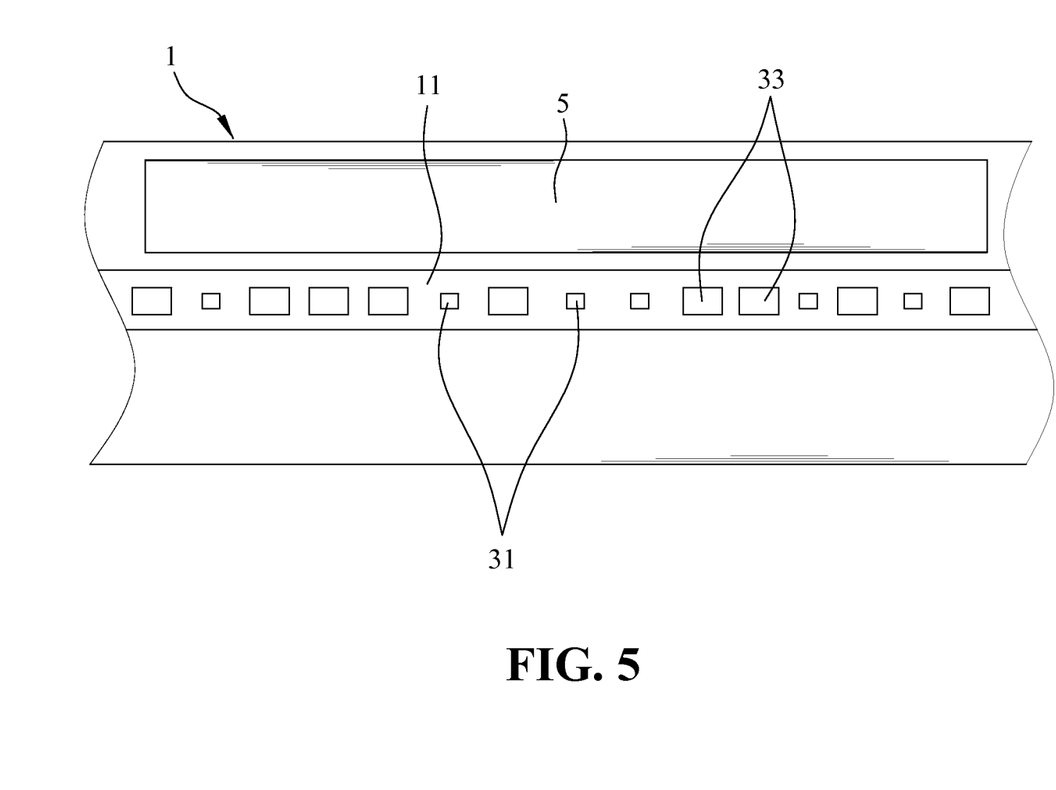
FIG. 5 is a top planar view illustrating a circuit unit employed in the method for fabricating the integrally formed LED light tube of the present invention.

FIG. 5 is a top planar view illustrating a circuit unit employed in the method for fabricating the integrally formed LED light tube of the present invention. In accordance with the step S30: a circuit unit 5 is fixed on the light emitting side ES of the heat dissipation base 1 in such a manner that the circuit 5 is located adjacent to one side of the recess 11. In this embodiment, the circuit unit 5 is preferably selected from a printed circuit board or a metal-core printed circuit board.

Figure 6:
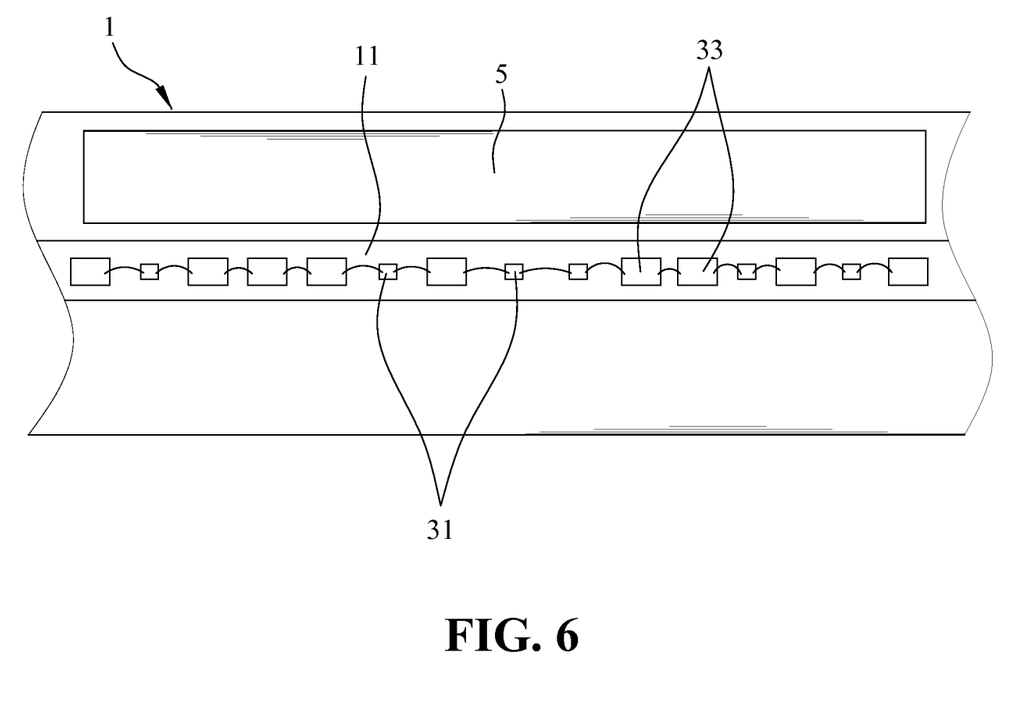
FIG. 6 illustrates how an illumination unit and a bridging unit are wire-bond together in the method for fabricating the integrally formed LED light tube of the present invention.

FIG. 6 illustrates how an illumination unit and a bridging unit are wire-bond together in the method for fabricating the integrally formed LED light tube of the present invention. In accordance with the step 40: the wire-bond technique is applied in order to connect the plurality of LED dies 31 and the plurality of conductive elements 33 electrically relative to one another.

Figure 7:
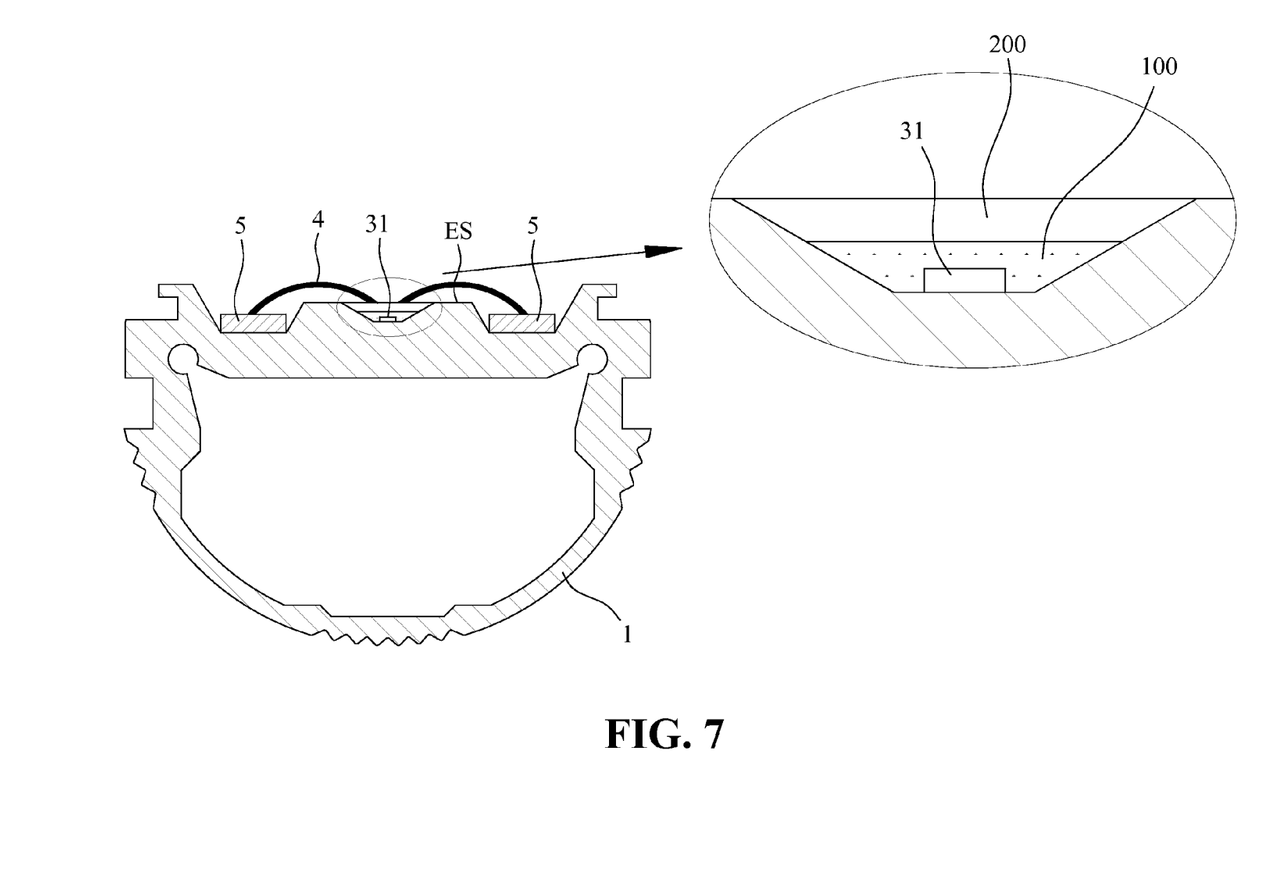
FIG. 7 is a cross-section view illustrating an optical layer and a protection layer employed in the method for fabricating the integrally formed LED light tube of the present invention.

FIG. 7 is a cross-section view illustrating an optical layer and a protection layer employed in the method for fabricating the integrally formed LED light tube of the present invention. In accordance with the step S50: an optical layer 100 is formed over the plurality of LED dies 31. In accordance with the step S60: a protection layer 200 is forming on the optical layer 100.

In this embodiment, the optical layer 100 provides the optical effects relative to the LED dies 31, such as color mixing for the light emitted from the LED dies 31. The optical layer 100 is preferably made from fluorescent glue or material mixture consisting of fluorescent glue and silicon resin. The protection layer 200 covers the optical layer 100 so as to isolate the vapor and dust from getting interior of the optical layer 100, thereby damaging the optical effects provided by the layer 100. Preferably, the protection layer 200 is mainly made from silicon resin.

The fabricating method of the present invention further includes a step of disposing an encapsulating layer (not visible) over the recess 11 prior to disposing the optical layer such that the encapsulating layer only covers the conductive elements 33 and but exposing the LED dies 31. In this embodiment, the encapsulating layer is fabricated from epoxy resin.

Figure 8:
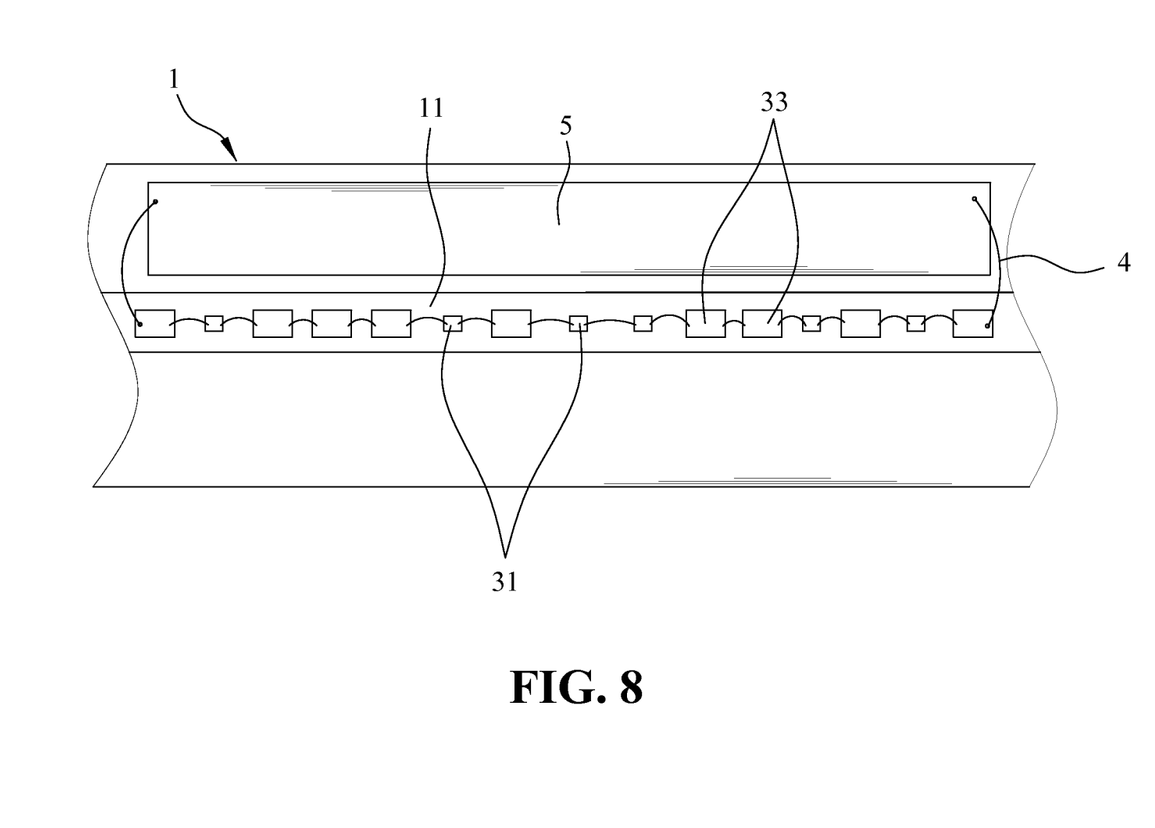
FIG. 8 is a top planar view illustrating how a circuit unit is electrically connected to the conductive element in the method for fabricating the integrally formed LED light tube of the present invention.

FIG. 8 is a top planar view illustrating how the circuit unit is electrically connected to the conductive element in the method for fabricating the integrally formed LED light tube of the present invention. In accordance with the step S70: electrical connection is established among the circuit unit 5, the plurality conductive elements 33 and the plurality of LED dies 3.

Figure 9:
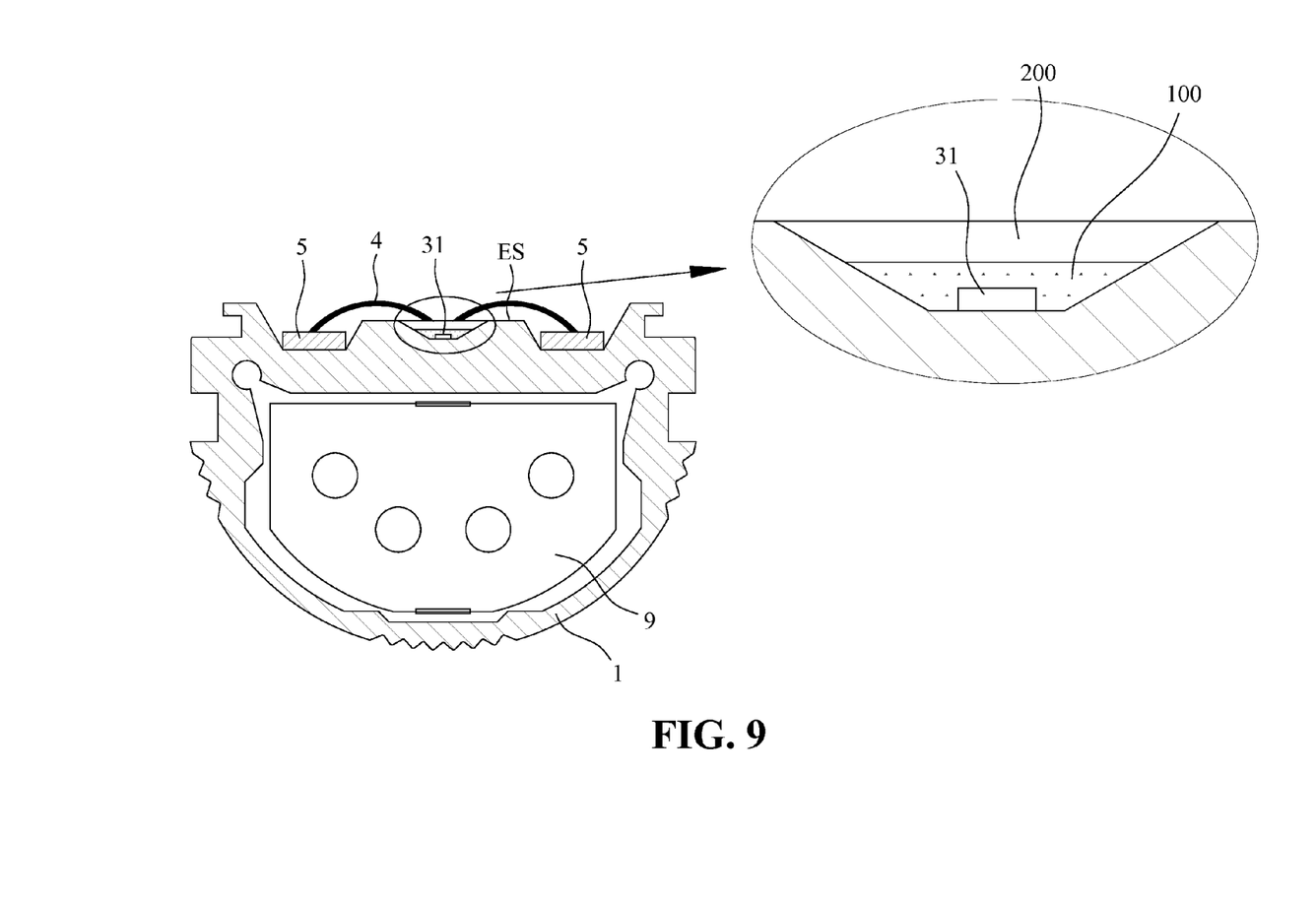
FIG. 9 is a cross-section view illustrating how a power supply source is installed in the method for fabricating the integrally formed LED light tube of the present invention.

FIG. 9 is a cross-section view illustrating how a power supply source is installed in the method for fabricating the integrally formed LED light tube of the present invention. In accordance with the step S80: a power supply source 9 is installed within the reception chamber in the heat dissipation base 1. Moreover, the circuit unit 5 has positive and negative ends soldered to two of the conductive elements 33 via an external wire 5, which has one end soldered to the soldering ball 335 of one of the joining pads of the respective one of the conductive elements 33.

Figure 10:
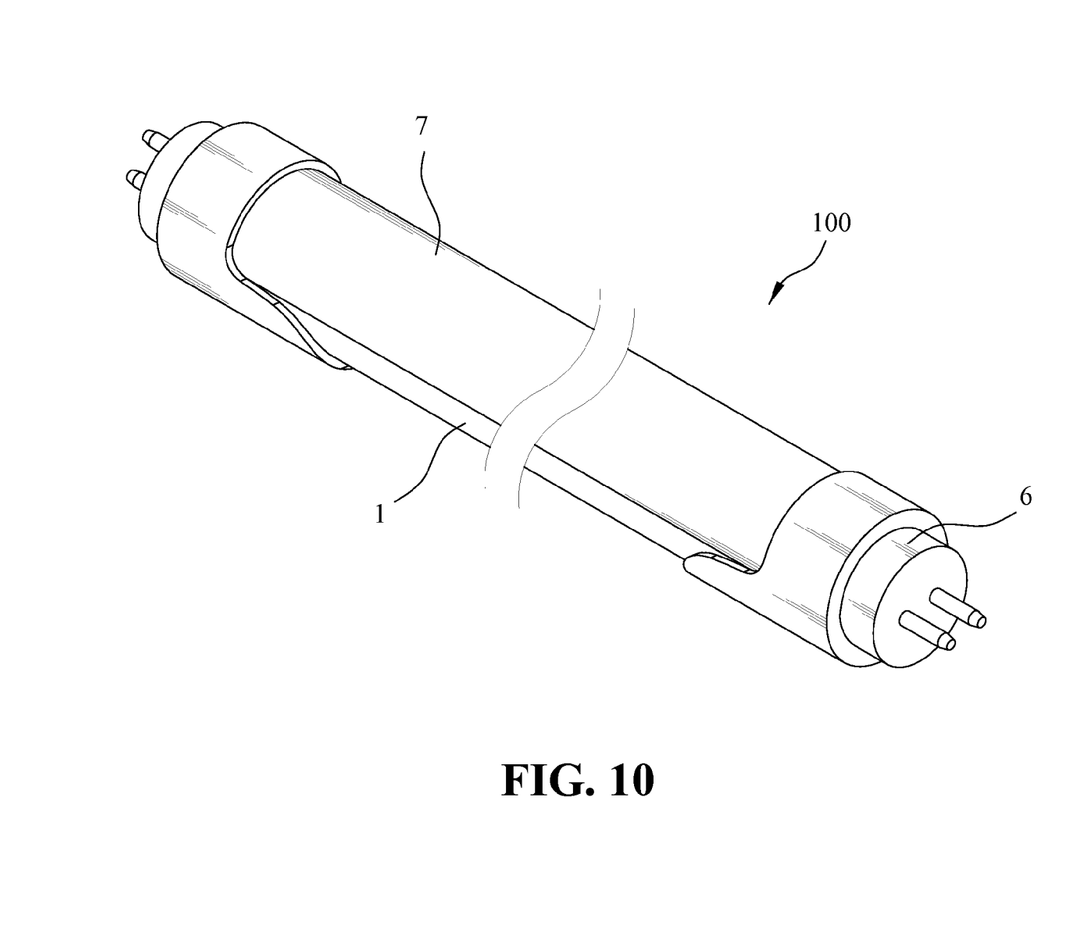
FIG. 10 is a perspective view of the integrally formed LED light tube fabricated in accordance with the method of the present invention.

FIG. 10 is a perspective view of the integrally formed LED light tube fabricated in accordance with the method of the present invention. At the final step S90: a diffusion shield 7 is disposed over the heat dissipation base 1 and after which, two end caps 6 are mounted respectively on two opposite ends of the heat dissipation base 1, thereby completing the fabrication of the LED light tube of the present invention.

The LED light tube of the present provides the following advantages; note that the recess 11 is relatively narrow in width and since the optical layer and the protection layer only need to cover the relatively small width of the recess 11 for shielding the LED dies 31, the cost of material expense is greatly reduced and hence shortening the manufacture time.

One distinct feature of the present invention resides in that once the LED dies are disposed on the bottom surface of the recess in the heat dissipation base, the optical layer and the protection layer can be sequentially disposed over the LED dies, thereby finishing the production of manufacturing the LED light tube of the present invention. Under such a situation, several fabrication steps of the prior are deleted, thereby shortening the fabrication time and process, which in turn provides high product yield of the LED light tube of the present invention.

Another distinct feature of the present invention resides in that the LED dies coupled electrically via the conductive elements for various objective can shorten the distance between adjacent pair of the LED dies. Hence an appropriate adjustment can be conducted among the LED dies in order to achieve densely arrangement of the LED dies so that the LED light tubes thus produced can provide the outmost amount of brightness. At the same time, during the wire-bond operation, since the LED dies and the conducting elements can be kept at appropriate distance, since shorter wires are required for wire bond purpose, tangling among the wires can be avoided.

In accordance with the integrally formed concept, the heat dissipation base with the recess, the illumination unit and the bridging unit are integrally fabricated. The heat dissipation base is fabricated in such a manner to have different longitudinal lengths so as to form the light tubes of different specifications. Hence, the cost of material expense is greatly reduced and hence shortening the manufacture time.

While the invention has been described in connection with what is considered the most practical and preferred embodiments, it is understood that this invention is not limited to the disclosed embodiments but is intended to cover various arrangement included within the spirit and scope of the broadest interpretation so as to encompass all such modifications and equivalent arrangements.

What is claimed is:

1. A method for fabricating a light emitting diode (LED) light tube comprising:
   fabricating a heat dissipation base having a light emitting side formed with a recess, said heat dissipation base further having an interior portion defining a reception chamber therein;
   disposing at least one illumination unit and at least one bridging unit on a bottom surface of said recess, wherein said illumination unit is constituted by a plurality of LED dies and said bridging unit is constituted by a plurality of conductive elements;
   fixing a circuit unit on said light emitting side of said heat dissipation base in such a manner that said circuit is located adjacent to one side of said recess;
   applying wire-bond technique in order to connect said plurality of LED dies and said plurality of conductive elements electrically relative to one another;
   forming an optical layer over said plurality of LED dies;
   forming a protection layer on said optical layer;
   establishing electrical connection among said circuit unit, said plurality conductive elements and said plurality of LED dies;
   installing a power supply source within said reception chamber in said heat dissipation base; and
   disposing a diffusion shield over said heat dissipation base and two end caps respectively on two opposite ends of said heat dissipation base.

2. The fabricating method according to claim 1, wherein said heat dissipation base is made from aluminum via extrusion method or die casting.

3. The fabricating method according to claim 1, wherein said bottom surface of said recess is undergone roughing treatment.

4. The fabricating method according to claim 1, wherein vapor deposition is conducted so as to form an aluminum layer on said bottom surface of said recess.

5. The fabricating method according to claim 1, wherein each of said conductive elements has a top surface formed with a conductive circuit and two joining pads at two opposite ends of said conductive circuit.

6. The fabricating method according to claim 5, further comprising a soldering ball disposed on one of said joining pads of a respective one of said conductive elements.

7. The fabricating method according to claim 6, wherein each of said conductive elements is a multi layer structure having a lower layer made from a silicone wafer, a ceramic chip or glass chip, said lower layer being constituted by from bottom to top a titanium layer and an aluminum layer, each being formed through bumping process.

8. The fabricating method according to claim 1, wherein said circuit unit is a printed circuit board or a metal-core printed circuit board.

9. The fabricating method according to claim 1, further comprising a step of disposing an encapsulating layer over said recess prior to disposing said optical layer such that said encapsulating layer only covers said conductive elements and exposing said LED dies, said encapsulating layer being fabricated from epoxy resin.

10. The fabricating method according to claim 6, wherein said circuit unit has positive and negative ends soldered to two of said conductive elements via an external wire, which has one end soldered to said soldering ball of said one of said joining pads of the respective one of said conductive elements.

* * * * *